United States Patent
Tsuruhara

(10) Patent No.: US 7,233,524 B2
(45) Date of Patent: Jun. 19, 2007

(54) SENSE AMPLIFIER CIRCUIT

(75) Inventor: Takao Tsuruhara, Obu (JP)

(73) Assignee: DENSO Corporation, Kariya (JP)

( * ) Notice: Subject to any disclaimer, the term of this patent is extended or adjusted under 35 U.S.C. 154(b) by 98 days.

(21) Appl. No.: 11/178,301

(22) Filed: Jul. 12, 2005

(65) Prior Publication Data

US 2006/0062065 A1    Mar. 23, 2006

(30) Foreign Application Priority Data

Sep. 17, 2004   (JP)   ............................. 2004-271465

(51) Int. Cl.
   *G11C 11/34*   (2006.01)
   *G11C 16/04*   (2006.01)
(52) U.S. Cl. .......................... 365/185.24; 365/185.21; 365/206; 365/207
(58) Field of Classification Search ........... 365/185.24, 365/185.21, 206, 207
   See application file for complete search history.

(56) References Cited

U.S. PATENT DOCUMENTS 5,422,854 A * 6/1995 Hirano et al. ............... 365/210
5,936,888 A * 8/1999 Sugawara ................. 365/185.2
6,377,484 B1 * 4/2002 Shau ....................... 365/185.03
6,801,466 B2 * 10/2004 Giove et al. ................ 365/207
6,856,547 B2 * 2/2005 Poidomani et al. ..... 365/185.21

FOREIGN PATENT DOCUMENTS

JP      A-5-242681      9/1993

* cited by examiner

*Primary Examiner*—Anh Phung
*Assistant Examiner*—Toan Le
(74) *Attorney, Agent, or Firm*—Posz Law Group, PLC

(57) ABSTRACT

A compact sense amplifier circuit for amplifying reading signal of an EPROM includes a bit line connected to cells of the EPROM and a transistor circuit for connecting a DC power source to the bit line. The transistor circuit includes a read circuit, a write circuit, a first path for passing current when a read signal for reading one of the cells that is not written is applied to the read circuit and a second path for passing current when a read signal for reading one of the cells that is written is applied to the read circuit. The first path and the second path are arranged to pass the same amount of current, thereby reducing sensor noises.

6 Claims, 3 Drawing Sheets

SENSE AMPLIFIER CIRCUIT

CROSS REFERENCE TO RELATED APPLICATION

The present application is based on and claims priority from Japanese Patent Application 2004-271465, filed Sep. 17, 2004, the contents of which are incorporated herein by reference.

BACKGROUND OF THE INVENTION

1. Field of the Invention

The present invention relates to a sense amplifier circuit that amplifies a read signal for reading an EPROM (erasable programmable read-only memory) for use in a sensor circuit.

2. Description of the Related Art

A sensor circuit for adjusting the sensitivity and/or the output signal power of a sensor usually includes an EPROM and a sense amplifier circuit. Usually, one sense amplifier circuit is provided for a plurality of cells of the EPROM in order to reduce the cost and the size of the sensor circuit. In this sensor circuit, however, the amount of current flowing through the sense amplifier circuit changes whether the EPROM has been written ("1") or not ("0") when the EPROM is read.

If one sense amplifier circuit is provided for each one of a plurality of cells of the EPROM to eliminate the difference between the written states of the EPROM, the size of the sensor circuit becomes larger, especially in the case of the sensor circuit being formed in one chip.

SUMMARY OF THE INVENTION

Therefore, an object of the present invention is to provide a compact sense amplifier circuit for reading an EPROM that is free from noises caused by fluctuation in current supplied thereto.

According to a feature of the invention, a sense amplifier circuit for amplifying a reading signal of an EPROM includes a DC power source terminal, a bit line connected to the cells of the EPROM and a transistor circuit for connecting the DC power source to the bit line. The transistor circuit includes a read circuit, a write circuit, a first path for passing current when a read signal for reading one of the cells that is not written is applied to the read circuit and a second path for passing current when a read signal for reading one of the cells that is written is applied to the read circuit, in which the first path and the second path are arranged to pass the same amount of current. The sense amplifier circuit may further include a NOR circuit that includes four transistors. In this case, the second path includes one of the four transistors, the size of which is arranged so as to pass the same amount of current as the first path.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

A preferred embodiment according to the present invention will be described with reference to the appended drawings.

Figure 3:
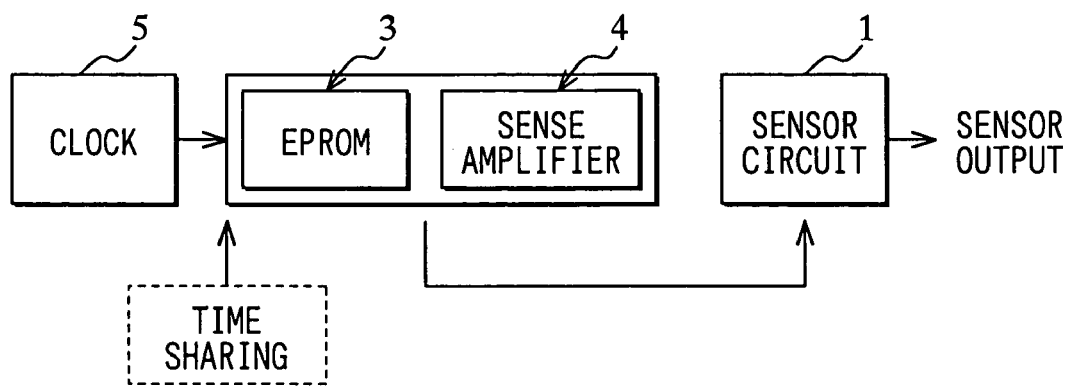
FIG. 3 is a block diagram illustrating a sensor circuit and its surrounding circuits.

As shown in FIG. 3, a sensor circuit 1 provides a sensor output, which is adjusted or corrected by data that are stored in a EPROM 3. A read signal of the EPROM 3 is amplified by a sense amplifier circuit 4.

The EPROM 3 has a plurality of cells for one sense amplifier circuit. A clock circuit is provided to read the cells of the EPROM 3 in a common time-sharing manner. The sensor circuit 1 and the EPROM 3 are integrated into a semiconductor chip, although they may be provided separately. The clock circuit 5 may be also integrated into the semiconductor chip.

Figure 1:
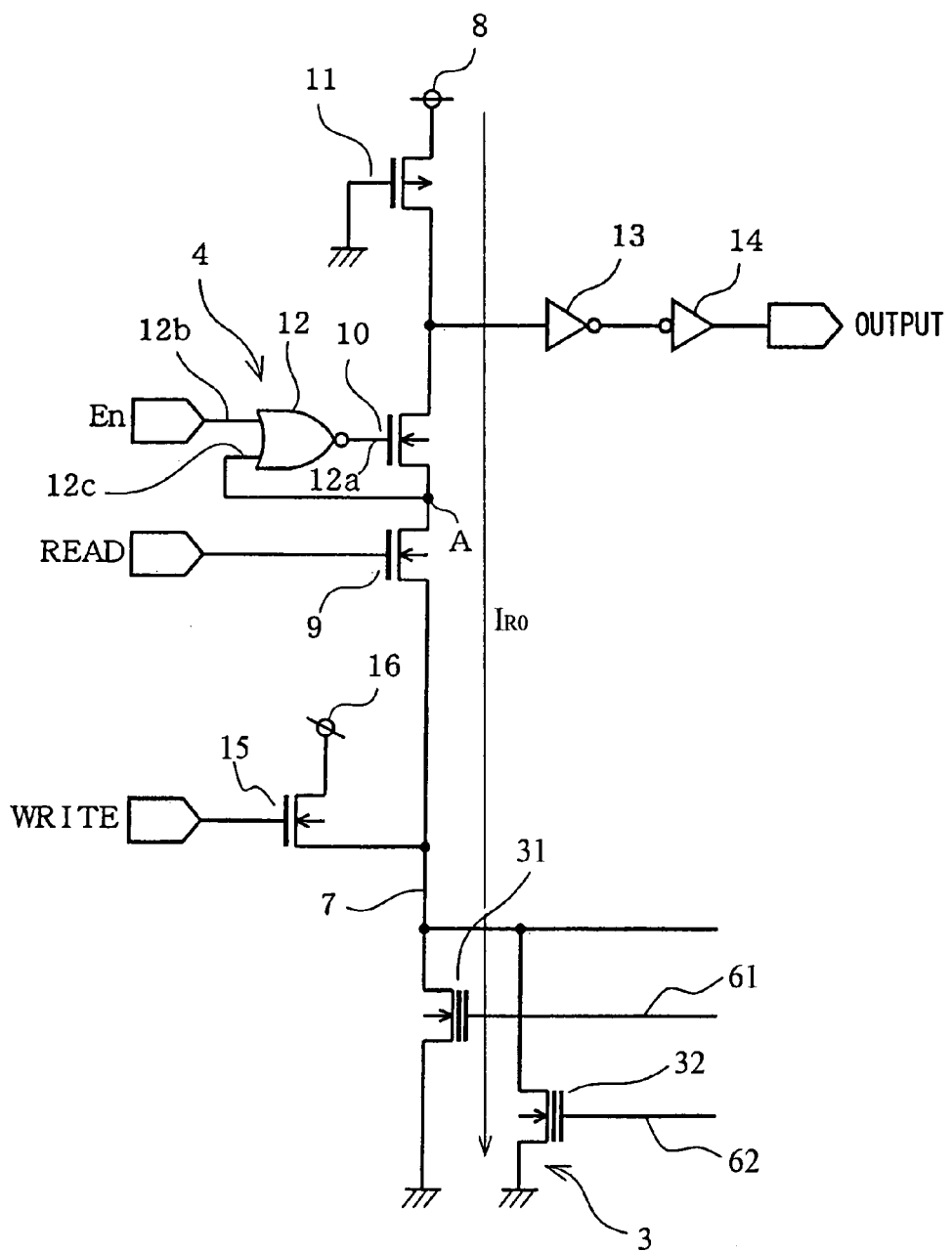
FIG. 1 is a circuit diagram of a sense amplifier circuit according to a preferred embodiment of the invention and an EPROM connected to the sense amplifier circuit.

As shown in FIG. 1, the EPROM 3 has a plurality of cells 31, 32. Each one of the cells 31, 32 has a gate to which a word line 61, 62 is connected, a source that is grounded and a drain that is connected to a bit line 7. The sense amplifier circuit 4 is a current-driven type amplifier circuit that includes a DC power terminal 8 of a constant voltage, series-connected N-MOS transistors 9, 10, a P-MOS transistor 11, a NOR circuit 12, series-connected NOT circuits 13, 14, an N-MOS transistor 15, etc. The N-MOS transistors 9, 10 and the P-MOS transistor 11 are connected in series between the bit line 7 and the DC terminal 8. The N-MOS transistor 9 has a gate that is connected to a READ terminal. The N-MOS transistor 10 has a gate that is connected to an output terminal 12*a* of the NOR circuit 12 that has a pair of input terminals 12*b*, 12*c* respectively connected to an En terminal and to a joint A that connects the N-MOS transistor 9 and the N-MOS transistor 10. The P-MOS transistor 11 has a gate that is grounded. The NOT circuit 13 has an input terminal that is connected to a joint connecting the N-MOS transistor 10 and the P-MOS transistor 11 and an output terminal connected to an input terminal of the NOT circuit 14 so that the NOT circuits 13, 14 are connected in series to each other. The NOT circuit 14 has an output terminal that is connected to the sense amplifier circuit 4. The N-MOS transistor 15 has a source that is connected to the bit line 7, which is connected to drains of the cells 31, 32 of the EPROM. The N-MOS transistor 15 also has a drain that is connected to a constant voltage DC terminal 16 and a gate that is connected to a WRITE terminal.

Figure 2:
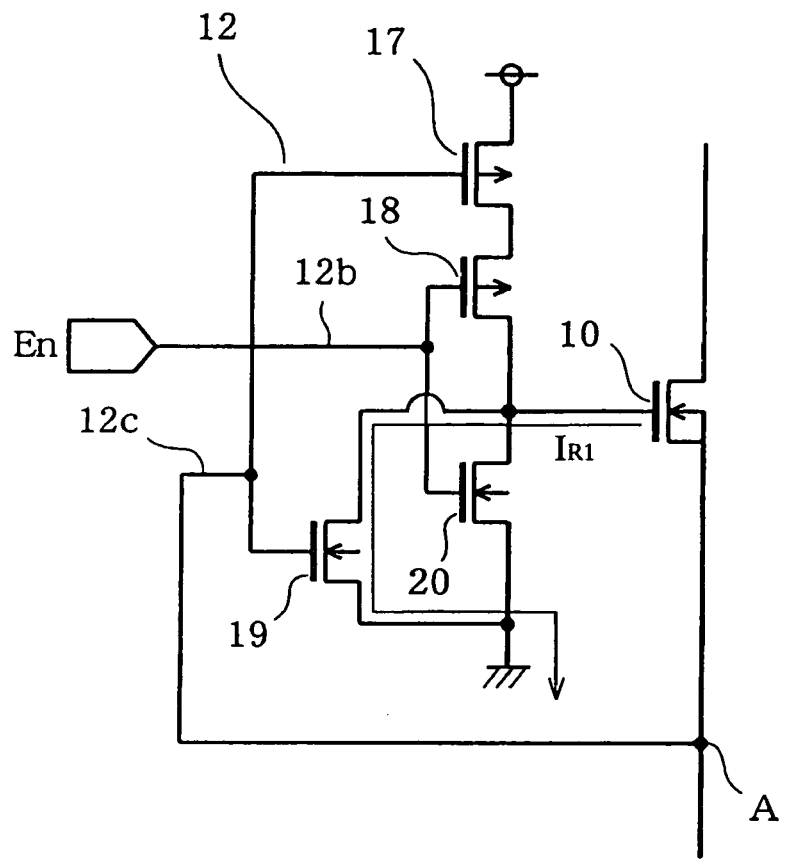
FIG. 2 is a circuit diagram of a NOR circuit that is shown in FIG. 1.

As shown in FIG. 2, the NOR circuit 12 includes a pair of P-MOS transistors 17, 18 and a pair of N-MOS transistors 19, 20. The P-MOS transistor 18 has a gate, which is connected to a gate of the N-MOS transistor 20 to form the input terminal 12*b* of the NOR circuit 12. The P-MOS transistor 17 has a gate, which is connected to a gate of the N-MOS transistor 19 to form the input terminal 12*c* of the NOR circuit 12. The P-MOS transistor 18 also has a drain, which is connected to a drain of the N-MOS transistor 19 and a drain of the N-MOS transistor 20 to form the output terminal 12*a* of the NOR circuit 12.

When the cell 31 of the EPROM 3 that has not been written (i.e. the cell being at "0") is read, reading current (input current) $I_{R0}$ flows from the DC power terminal 8 toward the cell 31, as shown in FIG. 1 because the cell 31 turns on. On the other hand, the cell 31 turns off due to increase in Vt of the cell 31 when the cell 31 has been written (i.e. the cell being at "1"). In this case, reading current (input current) $I_{R1}$ flows from the N-MOS transistor 10 through the N-MOS transistor 19 to the ground, as shown in FIG. 2.

The amount of the reading current $I_{R0}$ is determined by the size of the cell 31, the N-MOS transistor 9, 10 and the P-MOS transistor 11, and the size of the N-MOS transistor 19 of the NOR circuit 12 is determined so as to equalize the amount of the reading current $I_{R1}$ with that of the reading current $I_{R0}$, which is measured beforehand.

Figure 4:
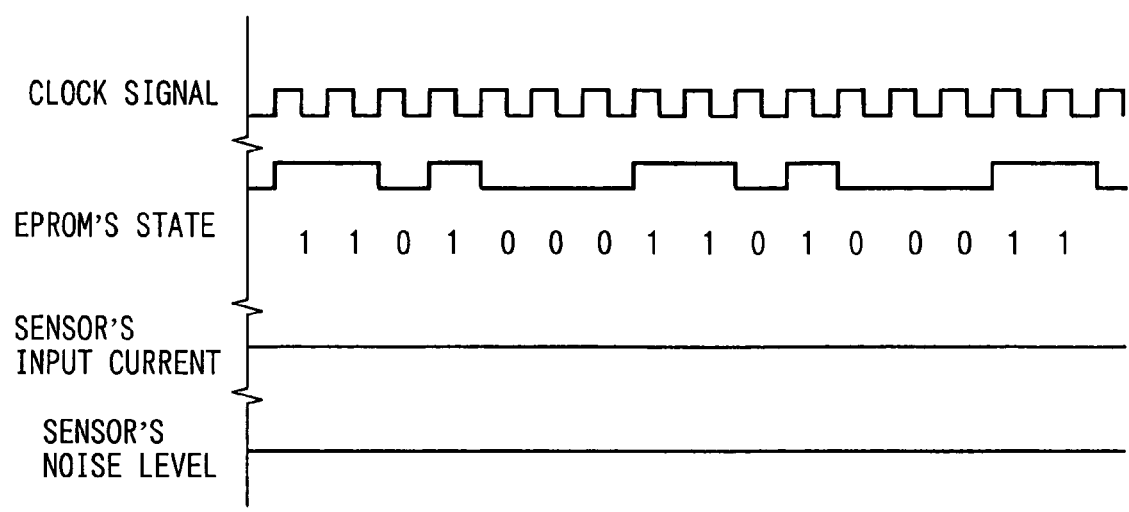
FIG. 4 is a time chart illustrating input current and output current of a sensor.

As a result, the reading current or sensor input current does not fluctuate as long as the EPROM 3 is read, as shown in FIG. 4.

In the foregoing description of the present invention, the invention has been disclosed with reference to specific embodiments thereof. It will, however, be evident that various modifications and changes may be made to the specific embodiments of the present invention without departing from the scope of the invention as set forth in the appended claims. Accordingly, the description of the present invention is to be regarded in an illustrative, rather than a restrictive, sense.

What is claimed is:

1. A sense amplifier circuit for amplifying reading signal of an EPROM having a plurality of cells, said sense amplifier circuit comprising:
    a DC power source terminal;
    a bit line connected to the cells of the EPROM; and
    a transistor circuit for connecting the DC power source terminal to the bit line, said transistor circuit including a read circuit, a write circuit, a first path for passing current when a read signal for reading one of the cells that is not written is applied to the read circuit and a second path for passing current when a read signal for reading one of the cells that is written is applied to the read circuit;
    wherein said first path and said second path are arranged to pass the same amount of current.

2. The sense amplifier circuit as claimed in claim 1, further including a NOR circuit that includes four transistors,
    wherein said second path comprises one of the four transistors, the size of which is arranged so as to pass the same amount of current as the first path.

3. A sense amplifier circuit for amplifying reading signal of an EPROM that can be written to have "1" state from "0" state:
    a transistor circuit including a first path for passing input current when the EPROM that is not written is read and a second path for passing input current when the EPROM that is written is read,
    wherein said first path and said second path are arranged to pass the same amount of current.

4. The sense amplifier circuit as claimed in claim 3, wherein said second path comprises a transistor, the size of which is arranged so as to pass the same amount of current as the first path.

5. A sense amplifier circuit for amplifying reading signal of an EPROM having a plurality of cells, said sense amplifier circuit comprising:
    a DC power source terminal;
    a bit line connected to the cells of the EPROM; and
    a transistor circuit for connecting the DC power source terminal to the bit line, said transistor circuit including a read circuit for receiving a read signal, a write circuit for receiving a write signal, a first path for passing current when the read circuit receives a read signal for reading one of the cells that is not written is applied and a second path for passing current when the read circuit receives a read signal for reading one of the cells that is written;
    wherein said first path and said second path are arranged to pass the same amount of current.

6. The sense amplifier circuit as claimed in claim 5, wherein:
    said first path comprises a first transistor connected in series to said bit line; and
    said second path comprises a NOR circuit having an output terminal connected to the gate of the first transistor;
    the NOR circuit comprises a second transistor having a gate as its input terminal and a source connected to a ground.

* * * * *